(12) United States Patent
Lee et al.

(10) Patent No.: US 12,355,435 B2
(45) Date of Patent: Jul. 8, 2025

(54) UNIVERSAL POWER FET DRIVER IC ARCHITECTURE

(71) Applicant: Efficient Power Conversion Corporation, El Segundo, CA (US)

(72) Inventors: Edward Lee, Fullerton, CA (US); Ravi Ananth, Laguna Niguel, CA (US); Michael Chapman, Long Beach, CA (US); Michael A. de Rooij, Playa Vista, CA (US); David C. Tam, Manhattan Beach, CA (US)

(73) Assignee: Efficient Power Conversion Corporation, El Segundo, CA (US)

( * ) Notice: Subject to any disclaimer, the term of this patent is extended or adjusted under 35 U.S.C. 154(b) by 0 days.

(21) Appl. No.: 18/344,162

(22) Filed: Jun. 29, 2023

(65) Prior Publication Data
US 2024/0007104 A1    Jan. 4, 2024

Related U.S. Application Data

(60) Provisional application No. 63/356,569, filed on Jun. 29, 2022.

(51) Int. Cl.
*H03K 17/687* (2006.01)
*H02M 1/08* (2006.01)
(Continued)

(52) U.S. Cl.
CPC .......... *H03K 17/6871* (2013.01); *H02M 1/08* (2013.01); *H02M 3/1584* (2013.01); *H03K 19/20* (2013.01)

(58) Field of Classification Search
CPC ............... H03K 17/6871; H03K 19/20; H03K 2017/307; H03K 2217/0063;
(Continued)

(56) References Cited

U.S. PATENT DOCUMENTS 9,667,245 B2   5/2017  de Rooij et al.
10,135,275 B2  11/2018  Kinzer et al.
(Continued)

FOREIGN PATENT DOCUMENTS

CN    105896987 A    8/2016
CN    109004820 A  * 12/2018    .............. H02J 7/007
(Continued)

OTHER PUBLICATIONS

L. Xiangdong et al., "Demonstration of GaN Integrated Half-Bridge With On-Chip Drivers on 200-mm Engineered Substrates", IEEE Electron Device Letters, vol. 40, No. 9, Sep. 2019.

*Primary Examiner* — Metasebia T Retebo
(74) *Attorney, Agent, or Firm* — Blank Rome LLP

(57) ABSTRACT

A gate driver circuit which integrates a synchronous bootstrap circuit in an isolation well of an integrated circuit, such that the synchronous bootstrap capacitor connected to the synchronous bootstrap circuit (and to the corresponding switch node of a power converter) can float with the corresponding switch node. Due to this feature, the voltage on one synchronous bootstrapping capacitor can be used to charge the synchronous bootstrapping capacitor of another (higher level) synchronous bootstrap circuit in a separate isolation well connected to a different switch node. As a result, the supply voltages for the synchronous bootstrap circuits in different isolation wells can all be supplied from a single ground referenced supply Vdd.

7 Claims, 11 Drawing Sheets

(51) Int. Cl.
*H02M 3/158* (2006.01)
*H03K 19/20* (2006.01)

(58) Field of Classification Search
CPC ......... H03K 2217/0072; H03K 17/063; H03K 2217/0081; H02M 1/08; H02M 3/1584; H02M 1/32; H02M 3/07; H02M 3/158
See application file for complete search history.

(56) References Cited

U.S. PATENT DOCUMENTS

| | | |
|---|---|---|
| 10,637,456 B2 | 4/2020 | Reusch et al. |
| 10,790,811 B2 | 9/2020 | Lee et al. |
| 2006/0017466 A1 | 1/2006 | Bryson |
| 2011/0260703 A1 | 11/2011 | Laur et al. |
| 2012/0043818 A1 | 2/2012 | Stratakos et al. |
| 2019/0028094 A1* | 1/2019 | Reusch ................. H02M 1/088 |
| 2019/0238119 A1 | 8/2019 | Chern et al. |
| 2020/0076415 A1 | 3/2020 | Lee et al. |
| 2020/0169253 A1 | 5/2020 | Hano et al. |
| 2022/0085718 A1* | 3/2022 | Singh ................... H03K 17/165 |
| 2023/0179203 A1 | 6/2023 | Lee et al. |

FOREIGN PATENT DOCUMENTS

| | | |
|---|---|---|
| CN | 110635676 A | 12/2019 |
| JP | 6100640 B2 | 3/2017 |
| TW | 201032015 A | 9/2010 |
| TW | 201206032 A | 2/2012 |
| TW | 201230293 A | 7/2012 |
| TW | 201629665 A | 8/2016 |
| TW | 201804277 A | 2/2018 |
| WO | WO 97/24794 | 7/1997 |
| WO | WO 2015/011879 A1 | 1/2015 |

* cited by examiner

UNIVERSAL POWER FET DRIVER IC ARCHITECTURE

CROSS-REFERENCE TO RELATED APPLICATION

This application claims the benefit of U.S. Provisional Application No. 63/356,434, filed Jun. 29, 2022, the disclosure of which is incorporated by reference in its entirety.

BACKGROUND OF THE INVENTION

Half-bridge integrated circuits typically use high-side field effect transistor (FET) gate drivers that implement a bootstrapping circuit to supply an increased voltage to the gate terminal of the high-side FET that is greater than the supply voltage. In particular, bootstrapping circuits make use of a bootstrap capacitor that charges during the on-state of the low-side FET of the half-bridge (when the SW terminal is shorted to ground), while the high-side FET is in an off-state. When the low-side FET is switched off, and the high-side FET is switched on, the voltage stored in the bootstrap capacitor is applied to the gate terminal of the high-side FET. However, this architecture is not suitable for some power converter topologies, such as multi-level converters, because the upper-level SW nodes in multi-level converters do not switch to ground. If the SW node does not bring the low-side electrode of the bootstrapping capacitor to ground, then the bootstrap capacitor does not fully charge, and the gate terminal of the high-side FET does not attain a voltage greater than the supply voltage to place the high-side FET in the on-state for proper functioning of the half-bridge circuit. Accordingly, a power FET driver is desired that can be used in a multi-level power converter topology.

FIG. 1 is a conventional half-bridge integrated circuit (IC) design with a synchronous bootstrap high-side gate driver circuit. The half-bridge IC design 100 of FIG. 1 includes high-side FET 102 and low-side FET 112 which are controlled to supply switched power at the SW node to a load 116 connected to an inductor 118 and a capacitor 120 in a buck converter topology.

High-side FET 102 is driven by a high-side gate driver 104, both which are formed within an isolation well 106. High-side gate driver 104 receives a high-side input signal from a level shifter 108, which is controlled by Logic Translator & Power-On Reset (POR) circuitry 110, which is in turn controlled by high-side input control signal 'HSin' and low-side input control signal 'LSin' Low-side FET 112 is driven by a low-side gate driver 114 that receives a control signal from Logic Translator & POR circuitry 110 based upon the high-side signal 'HSin' and low-side signal 'LSin'.

In the half-bridge IC circuit of FIG. 1, supply voltages for the high-side circuit elements, which include the level shifter 108 and the high-side gate driver 104, are provided by a synchronous bootstrap circuit, including bootstrap capacitor 122 and bootstrap diode 112. The bootstrap capacitor 122 is charged by a supply voltage $V_{dd}$ through a diode 124 when a high-side input signal 'HSin' is at a logic level 0, with the high-side FET 102 turned off, and a low-side input signal 'LSin' is at a logic level 1, with the low-side FET 112 turned on. Accordingly, the SW node is switched to ground and the bootstrap capacitor 122 charges through diode 112 to acquire a voltage $V_{dd}$ minus the diode drop across it. This in turn creates a voltage $V_{ddF}$, that is $V_{dd}$ minus the diode drop above the voltage at the SW node. When 'HSin' is at a logic level 1, $V_{ddF}$ ensures that the gate to source voltage of high-side FET 102 is sufficiently high to turn the transistor on.

The half-bridge IC design 100 of FIG. 1 is not suitable for all power converter topologies. In particular, the half-bridge design 100 cannot be used in multi-level power converters, since the SW node does not always switch to ground in such topologies. As a result, the synchronous bootstrap capacitor 122 cannot be fully recharged by $V_{dd}$ and the half-bridge IC design 100 may not function properly. Additionally, charging the synchronous bootstrap capacitor 122 through the diode 112 reduces $V_{ddF}$ due to the voltage drop associated with the diode 112. To address this latter issue, in the half-bridge IC design of FIG. 2, diode 124 (FIG. 1) is replaced with a synchronous bootstrap FET 240 that is driven by a synchronous bootstrap driver 242, which is controlled by Logic Translator & POR circuitry 210.

In the synchronous bootstrap circuit of FIG. 2, the voltage drop associated with diode 112 of FIG. 1 is eliminated, such that $V_{ddF}-V_{SW}$ is approximately $V_{dd}$. However, like the circuit of FIG. 1, the synchronous bootstrap driver 242 must have an output logic 1 voltage greater than $V_{dd}$ to turn on high-side FET 202. Thus, like the half-bridge IC design 100 depicted in FIG. 1, the half-bridge IC design 200 shown in FIG. 2 cannot be implemented in multi-level power converters.

FIG. 3 is circuit diagram showing a synchronous bootstrap driver 300 suitable for GaN technologies. Synchronous bootstrap driver 300, disclosed in U.S. Pat. No. 9,667,245, incorporated herein by reference, includes a FET 304 and capacitor 306. When low-side gate driver 314 is at logic level 0 (0V), capacitor 306 is charged to approximate $V_{dd}-V_{th}$, where $V_{th}$ is the threshold voltage of FET 304. When low-side gate driver 308 is at a logic level 1 ($V_{dd}$), the synchronous bootstrap voltage $V_{SB}$ at the gate of synchronous bootstrap FET 320 is approximately $2V_{dd}-V_{th}$. Thus, the gate of synchronous bootstrap FET 320 is turned on with a gate-to-source voltage of $V_{dd}-V_{th}$. However, since the threshold voltage $V_{th}$ of the synchronous bootstrap FET 310 can vary by relatively large amounts, a gate-to-source voltage of $V_{dd}-V_{th}$ may be insufficient to turn on synchronous bootstrap FET 320.

It would therefore be desirable to provide a power FET driver that overcomes the disadvantages of the prior art described above and can be implemented universally without the above-noted disadvantages. In particular, it would be desirable to provide a power FET driver IC that can be implemented universally to drive power FETs in any power FET driver topology.

SUMMARY OF THE INVENTION

The present invention overcomes the disadvantages and achieves the objectives described above by providing a power FET driver architecture that can be implemented universally in any power FET driver topology.

More specifically, the present invention, as described herein, is a gate driver circuit which integrates a synchronous bootstrap circuit in an isolation well of an integrated circuit, such that the synchronous bootstrap capacitor connected to the synchronous bootstrap circuit (and to the corresponding switch node of a power converter) can float with the corresponding switch node. Due to this feature, the voltage on one synchronous bootstrapping capacitor can be used for charging up the synchronous bootstrapping capacitor of another (higher level) synchronous bootstrap circuit in a separate isolation well connected to a different switch node. As a result, the supply voltages for the synchronous bootstrap circuits in different isolation wells can all be supplied from a single ground referenced supply Vdd. Accordingly, the present invention can be used for implementing various power converter topologies, including multi-level converters.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

The advantages and features of the present invention will become apparent when the following description of the preferred embodiments of the invention is read in conjunction with the accompanying drawings, in which.

DETAILED DESCRIPTION OF THE PREFERRED EMBODIMENTS

It is to be understood that the figures and descriptions of the present invention may have been simplified to illustrate only elements that are relevant for a clear understanding of the present embodiments. Those of ordinary skill in the art will recognize that other elements may be desirable and/or required in order to implement the present embodiments. It is also to be understood that the drawings included herewith only provide diagrammatic representations of the presently preferred embodiments of the present invention. Reference will now be made to the drawings wherein like structures are provided with like reference designations.

Figure 1:
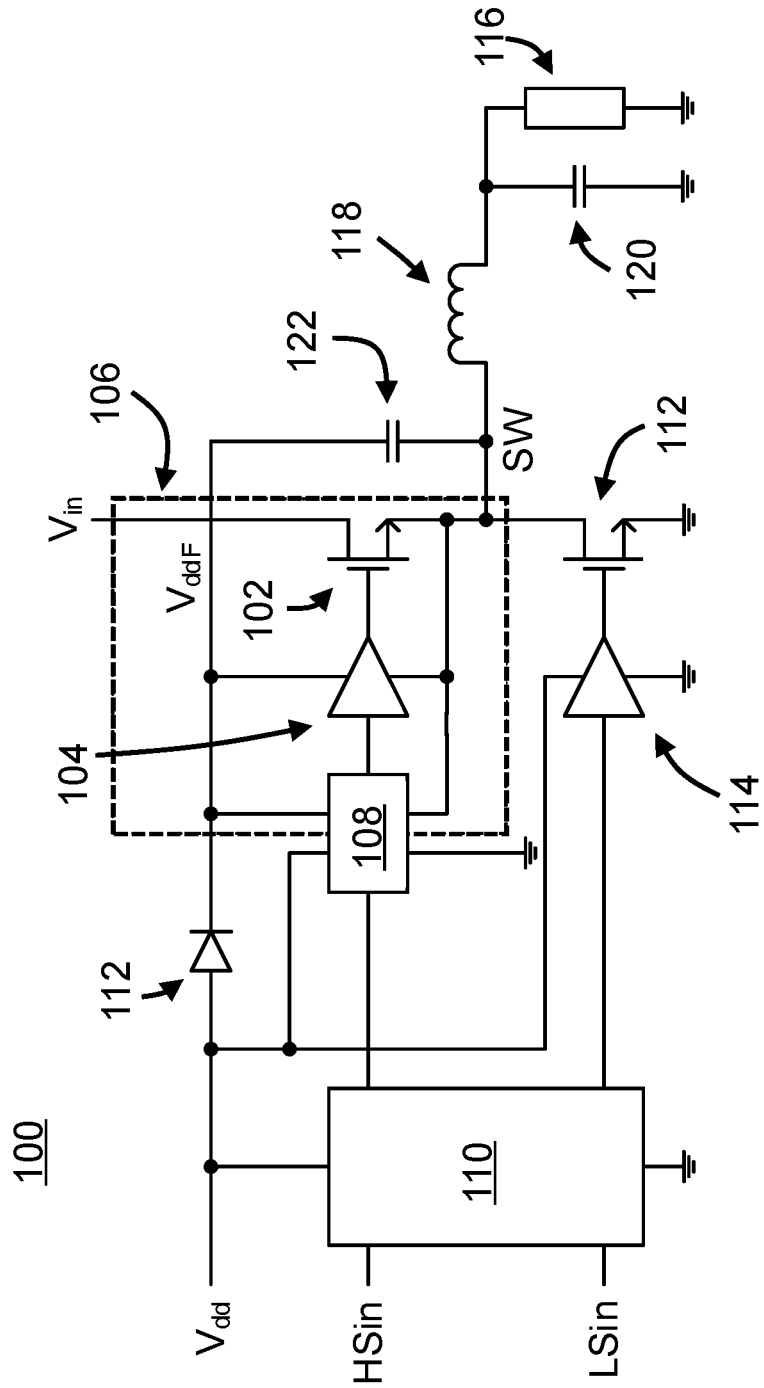
FIG. 1 is a conventional half-bridge buck converter with a synchronous bootstrap circuit.
Figure 2:
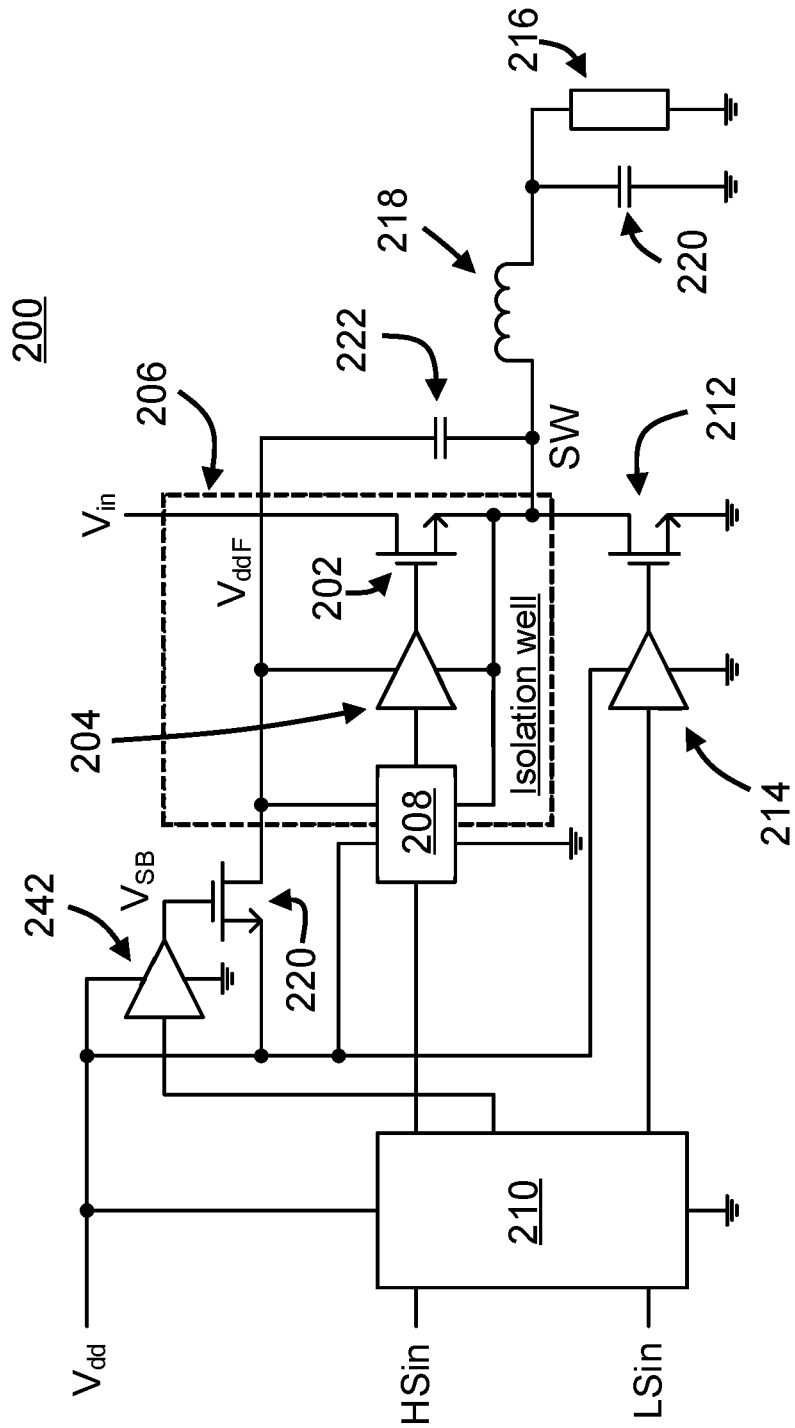
FIG. 2 is a conventional half-bridge buck converter with a synchronous bootstrap FET.
Figure 3:
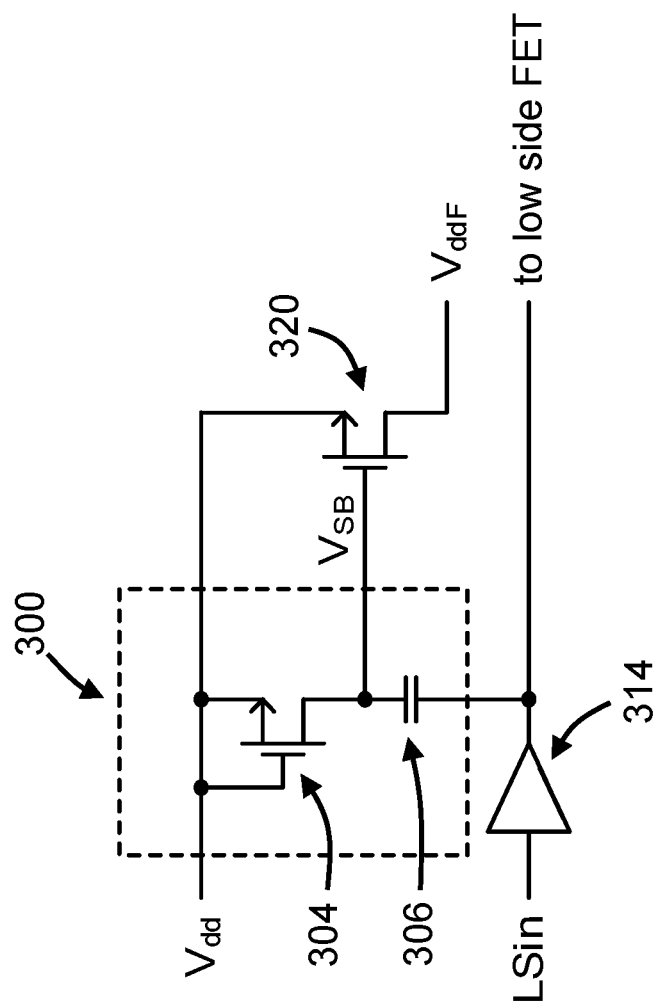
FIG. 3 shows a synchronous bootstrap driver suitable for GaN technologies.
Figure 4:
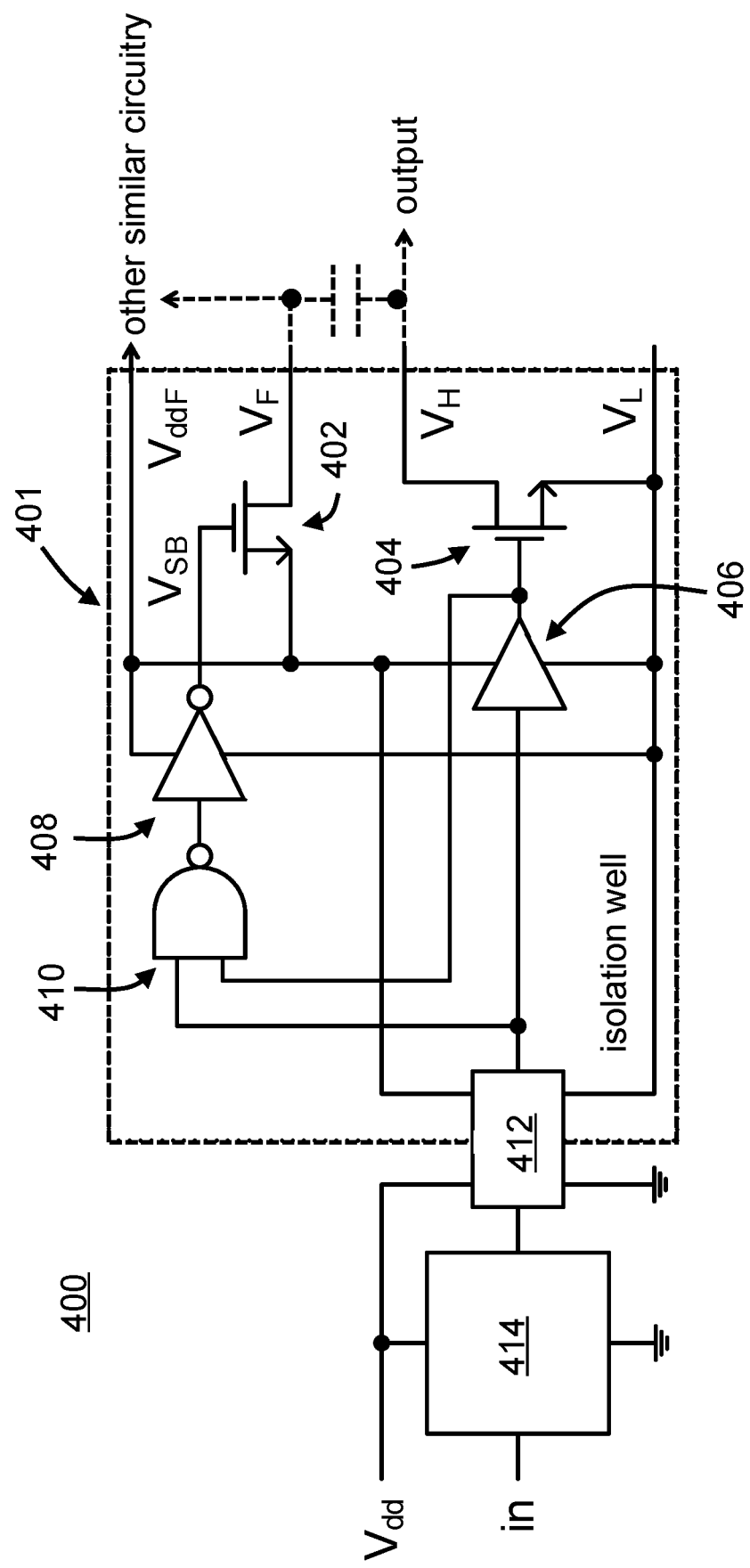
FIG. 4 shows the universal power FET driver circuit of the present invention.

FIG. 4 shows the basic architecture of the universal power FET driver IC of the present invention. Universal power FET driver IC 400 includes the power FET gate driver circuit 401 of the present invention provided in an isolation well, controlled by logic translator and power-on reset circuitry 414, and a level shifter 412 (the receiver of which is disposed in the isolation well). The isolation well is formed from known processes and provides electrical isolation from other semiconductor circuit elements in the IC. The circuit elements of the gate driver of the present invention, namely synchronous bootstrap FET 402, a power FET 404, a gate driver 406 for driving the power FET 404, a synchronous bootstrap gate driver 408 for driving the synchronous bootstrap FET 402, NAND gate 410, and the receiver of level shifter 412, are all integrated in a single isolation well. In the preferred embodiment of the present invention, the synchronous bootstrap gate driver of the present invention is implemented in GaN technology.

In the operation of the power FET driver IC of the present invention, logic translator/power-on reset circuitry 414 receives an input control signal 'in' and produces a corresponding control signal to level shifter 412. The level shifter 412 produces either a level shifted logic 0 output or a level shifted logic 1 output based upon the input control signal "in". The logic 0 or logic 1 output of the level shifter 412 is provided as an input to the logic gate 410 and the gate driver 406.

When the level shifter 412 produces a logic 1, FET 404 is turned on and $V_H$ is shorted to $V_L$. In the basic circuit shown in FIG. 4, $V_L$ is ground, so turning on FET 404 connects $V_H$ to ground. Both inputs of the NAND gate 410 also receive the logic 1, such that NAND gate 410 produces a logic 0 that is input to the synchronous bootstrap gate driver 408, so that gate driver 408 produces a logic 1 to the gate of FET 402. As a result, FET 402 is turned on and the synchronous bootstrap capacitor $C_{SB}$ charges from supply voltage $V_{ddF}$.

Figure 5:
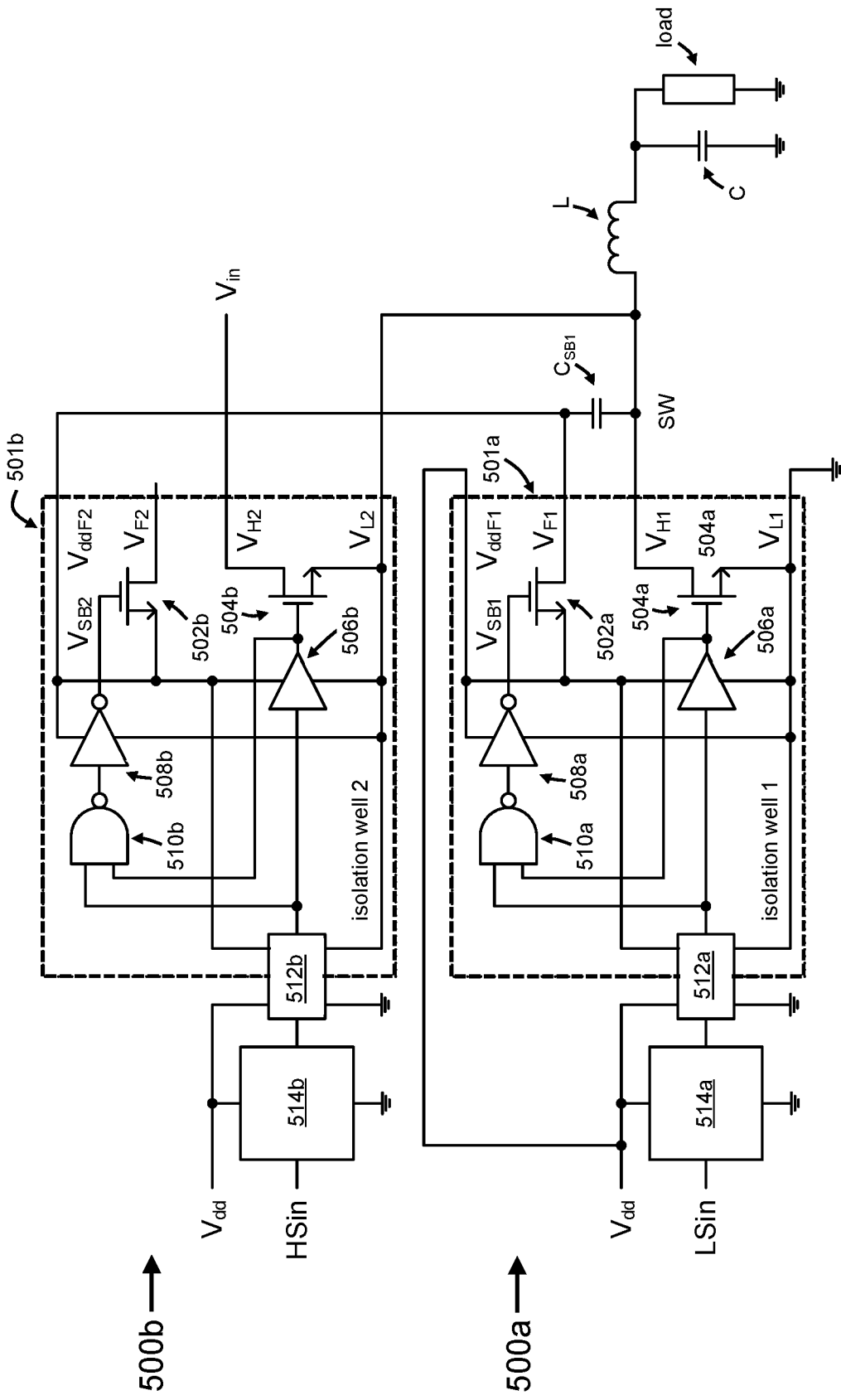
FIG. 5 shows a buck converter implementation of the universal power FET driver circuit of the present invention.
Figure 7:
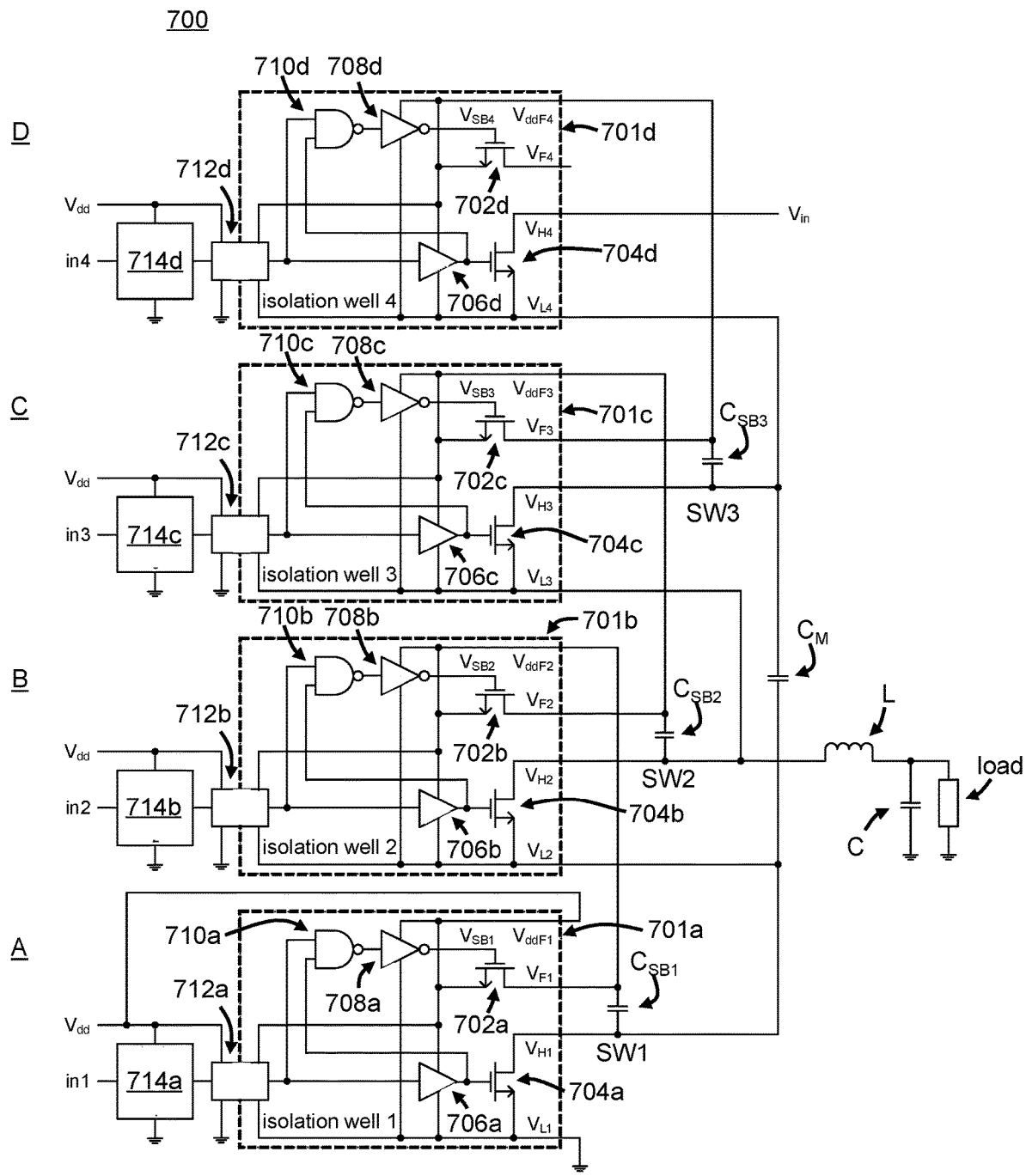
FIG. 7 shows a tri-level power converter IC using multiple universal power FET driver circuits of the present invention.

When the level shifter 412 produces a logic 0, FET 404 is turned off and $V_H$ is disconnected from $V_L$. Both inputs of NAND gate 410 also receive the logic 0, such that NAND gate produces a logic 1 that is input to the synchronous bootstrap gate driver 408, which produces a logic 0 to the gate of FET 402. As a result, FET 402 is turned off and the voltage $V_F$ stored on synchronous bootstrap capacitor $C_{SB}$ can be used to power similar gate drive circuitry in a different isolation well, as shown in FIGS. 5 and 7. This feature of the circuit of FIG. 4 allows it to be used universally in an architecture suitable for implementing power converters with many different topologies, including multi-level converters.

NAND gate 410 is provided to advance turn-off of synchronous boot driver 408 before power FET 404 turns off, and to delay turn-on of synchronous bootstrap driver 408 after power FET 404 turns on. NAND gate thereby prevents overcharging of a synchronous bootstrap capacitor during the dead time of the power converter.

FIG. 5 is a half-bridge buck converter implementation using two of the universal power FET driver integrated circuits of FIG. 4 with a synchronous bootstrap capacitor $C_{SB1}$. The low-side power FET driver integrated circuit 500a (bottom) includes low-side power FET 504a and receives a low-side input control signal 'LSin'. The high-side power FET driver integrated circuit (top) includes high-side power FET 504b and receives a high-side input control signal 'HSin'. The low-side synchronous gate driver circuit 501a, including synchronous bootstrap FET 502a, synchronous bootstrap gate driver 508a, and power FET 504a, is provided in isolation well 1, and is powered by supply voltage $V_{dd}$. The high-side synchronous gate driver circuit 501b, including synchronous bootstrap FET 502b, synchronous bootstrap gate driver 508b, and power FET 504b, is provided in isolation well 2, and is powered by the voltage on the synchronous bootstrap capacitor, $V_{F1}$, rather than $V_{dd}$. Thus, the voltage stored on the synchronous bootstrap capacitor in isolation well 2 is charged by the voltage stored on the synchronous bootstrap capacitor in isolation well 1.

Figure 6:
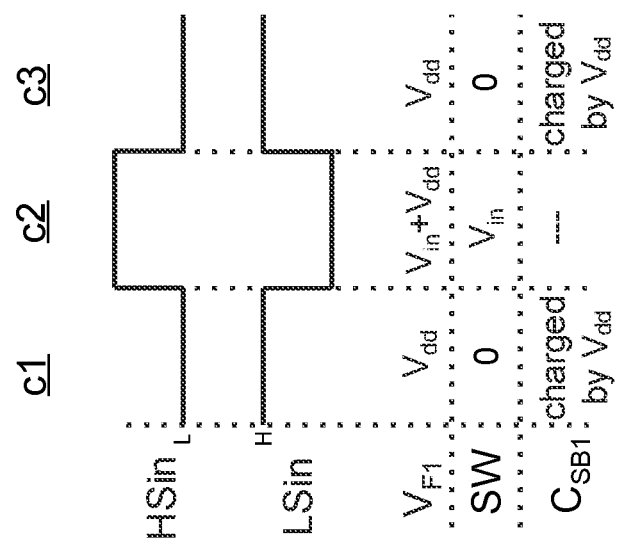
FIG. 6 is a timing diagram for the circuit of FIG. 5.

FIG. 6 is a timing diagram for the power converter of FIG. 5. At condition c1, when a logic 1 is provided as a low-side input signal 'LSin' and a logic 0 is provided as a high-side input signal 'HSin', synchronous bootstrap FET 502a and low-side power FET 504a both turn on, and synchronous bootstrap capacitor $C_{SB1}$ charges to $V_{dd}$.

At condition c2, the control inputs switch, such that a logic 0 is provided as the low-side input signal 'LSin' and a logic 1 is provided as the high-side input signal 'HSin'. The low-side synchronous bootstrap FET 502a and the low-side power FET 504a both turn off, while the high-side synchronous bootstrap FET 502 and the high-side power FET 504b both turn on, shorting $V_{in}$ to the switch node SW, driving the load. The voltage on the bootstrap capacitor $C_{SB1}$, i.e., $V_{F1}$, comprises the additive combination of the input voltage $V_{in}$ and the stored supply voltage $V_{dd}$, which powers the gate driver circuitry 506b in isolation well 2.

Condition c3 is substantially the same as condition c1, and the synchronous bootstrap capacitor $C_{SB1}$ is again charged by $V_{dd}$, and the cycle repeats.

FIG. 7 shows a tri-level buck power converter 700, which includes four of the power FET driver circuits 400 of FIG. 4, three synchronous bootstrap capacitors $C_{SB1}$, $C_{SB2}$, and $C_{SB3}$, and a capacitor $C_M$. Although FIG. 7 depicts four of the power FET driver circuits 400 to form a tri-level converter, any multiple N of the power FET driver circuits 400 may depicted in FIG. 4 may be implemented as shown in FIG. 7 to form a (N−1)-level converter.

As shown in FIG. 7, the voltages on synchronous bootstrap capacitors $C_{SB1}$, $C_{SB2}$, and $C_{SB3}$ provide supply voltages for synchronous gate driver circuits 701b, 701c, and 701d, respectively, disposed in isolation wells 2, 3, and 4, respectively, that drive the corresponding power FETs 704b, 704c, and 704d. Capacitor $C_M$, connected on one side to the drain of FET 704a and the source of FET 704b, and on the other side, to the drain of FET 704c and the source of FET 704d, provides the tri-level voltage level of approximately $V_{in}/2$ in a tri-level power converter.

Figure 8A:
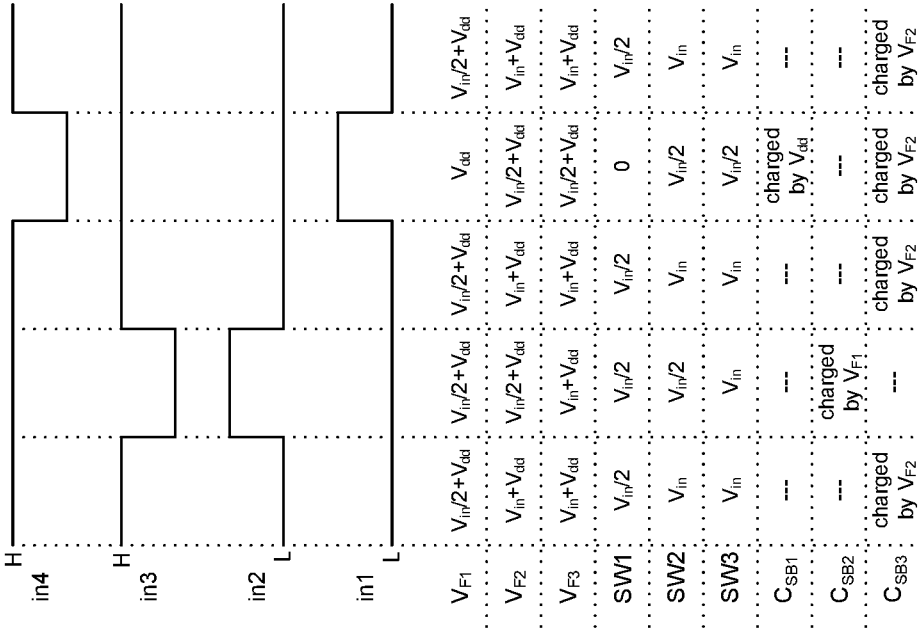
FIGS. 8A and 8B are timing diagrams for the circuit of FIG. 7.
Figure 8B:
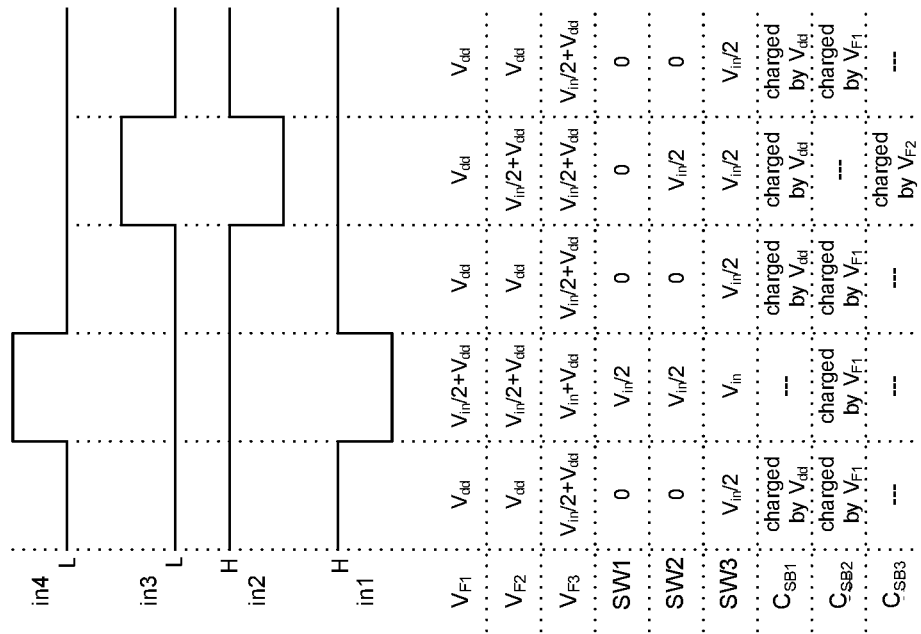

FIGS. 8A and 8B are timing diagrams showing the charging of the three bootstrap capacitors $C_{SB1}$, $C_{SB2}$, and $C_{SB3}$, and the respective charging voltages $V_{F1}$, $V_{F2}$, and $V_{F3}$ and switch node voltages SW1, SW2, and SW3, in the tri-level converter of FIG. 7 for a duty cycle of less than 50% (FIG. 8A) and a duty cycle of more than 50% (FIG. 8B).

In FIG. 8A, for the condition in the first column, both in1 and in2 are on. Hence, the outputs of drivers 708a and 708b are at logic 1. As a result, $C_{SB1}$ will be charged by $V_{dd}$ through FET 702a and $C_{SB2}$ will be charged by $V_{F1}$ through FET 702b. For the condition in the second column, only in2 is on. Hence, only the output of driver 708b is at logic 1. As a result, $C_{SB2}$ will be charged by $V_{F1}$ through FET 702b. For the condition in the third column, both in1 and in2 are on, similar to the condition on the first column. Hence, the outputs of drivers 708a and 708b are at logic 1. As a result, $C_{SB1}$ will be charged by $V_{dd}$ through FET 702a and $C_{SB2}$ will be charged by $V_{F1}$ through FET 702b. For the condition in the fourth column, in1 and in3 are on. Hence, the outputs of drivers 708a and 708c are at logic 1. As a result, $C_{SB1}$ will be charged by $V_{dd}$ through FET 702a and $C_{SB3}$ will be charged by $V_{F2}$ through FET 702c. The condition in the fifth column is substantially the same as the condition on the first column, and the cycle repeats.

In FIG. 8B, for the condition in the first column, in3 is on. Hence, the output of driver 708c is at logic 1. As a result, $C_{SB3}$ will be charged by $V_{F2}$ through FET 702c. For the condition on the second column, in2 is on. Hence, the output of driver 708b is at logic 1. As a result, $C_{SB2}$ will be charged by $V_{F1}$ through FET 702b. For the condition in the second column, in3 is on, similar to the condition on the first column. Hence, the output of driver 708c is at logic 1. As a result, $C_{SB3}$ will be charged by $V_{F2}$ through FET 702c. For the condition in the fourth column, in1 and in3 are on. Hence, the outputs of drivers 708a and 708c are at logic 1. As a result, $C_{SB1}$ will be charged by $V_{dd}$ through FET 702a and $C_{SB3}$ will be charged by $V_{F2}$ through FET 702c. The condition on the fifth column is substantially the same as the condition on the first column, and the cycle repeats.

Figure 9:
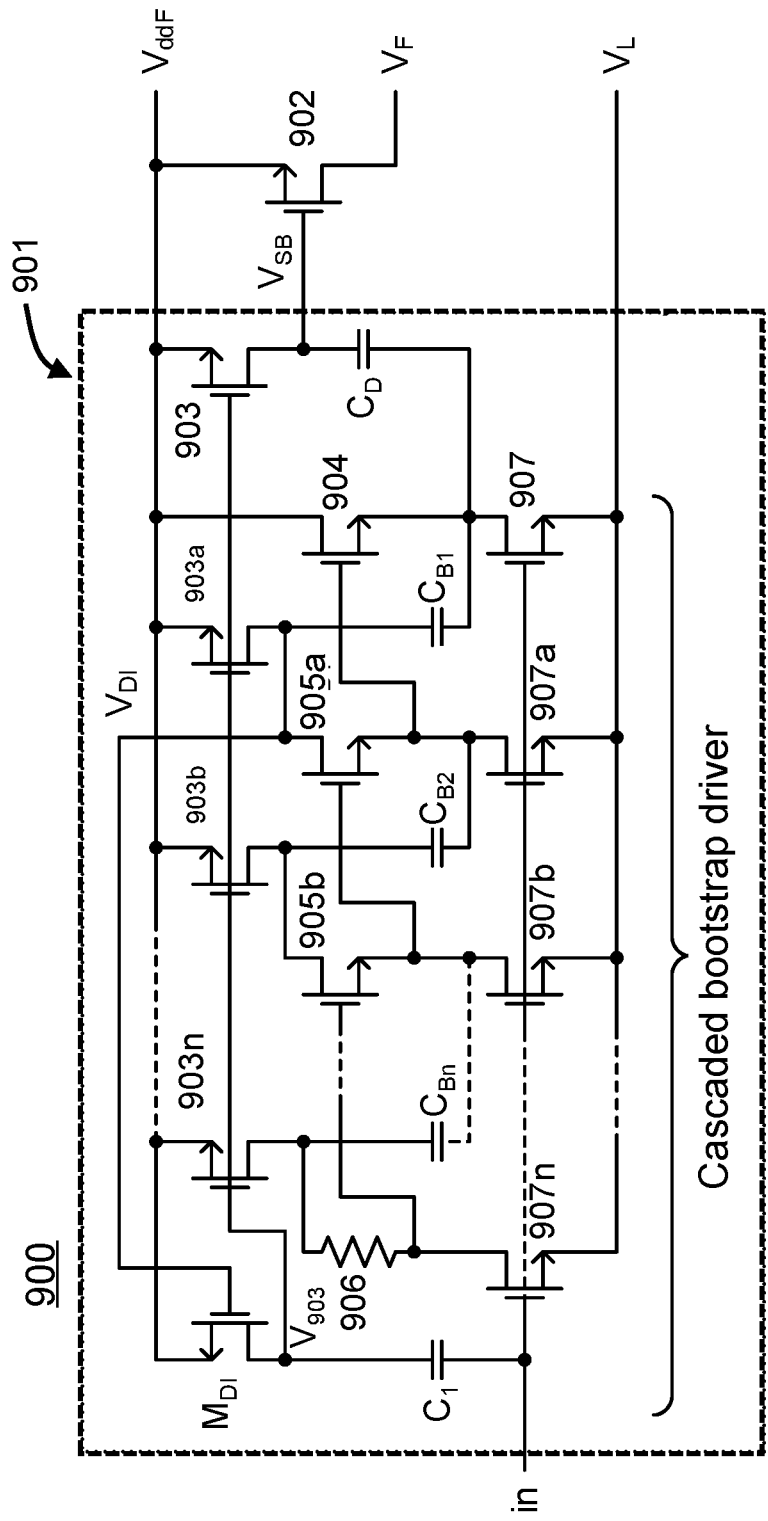
FIG. 9 shows the synchronous bootstrap driver of the present invention incorporated in a cascaded topology.

FIG. 9 shows a cascaded active bootstrapping topology 900 for the synchronous bootstrap driver circuit of the universal power FET driver of the present invention. The cascaded active bootstrapping gate driver circuit 901 of FIG. 9, which drives the gate of synchronous bootstrap FET 902 through capacitor $C_D$, may be used for the synchronous bootstrap gate driver 408 (in FIG. 4), the synchronous bootstrap gate drivers 508a and 508b (in FIG. 5), and the synchronous bootstrap gate drivers 708a, 708b, 708c, and 708d (in FIG. 7).

The cascaded active bootstrapping gate driver topology of FIG. 9 combines the active bootstrapping gate driver circuitry disclosed in U.S. Patent Application Publication No. 2023/0179203, and the cascaded bootstrapping gate driver circuitry disclosed in U.S. Pat. No. 10,790,811, the disclosures of which are herein incorporated by reference.

As described in detail in U.S. Pat. No. 10,790,811, the cascaded bootstrapping gate driver circuitry, preferably implemented with GaN FET transistors, provides quick turn-on of a high side power FET and low static current consumption during transistor turn-off. The initial bootstrapping stage (on the left) includes FET 903n, capacitor CB n and resistor 906. (The resistor 906 decreases static current consumption during transistor turn-off). In the secondary bootstrapping stages (i.e., FETs 903a, 903b, and corresponding bootstrap capacitors $C_{B1}$, $C_{B2}$, respectively), resistor 906 of the initial bootstrapping stage is substituted with a FET (i.e., FETs 905a, 905b).

In the active topology, as described in U.S. Patent Application Publication No. 2023/0179203, the voltage stored on the first bootstrap capacitor C D for turning on the high side (pull up) FET 902 of the driver is charged to the full supply voltage using an active charging FET (903, 903a, 903b . . . 903n) instead of a diode or diode-connected FET as in a conventional bootstrapping driver. The gate voltage of the active charging FET is bootstrapped to a voltage higher than the supply voltage by a preceding bootstrap capacitor ($C_{B1}$, $C_{B2}$ . . . $C_{Bn}$) The preceding bootstrap capacitors are charged by FETs (903a, 903b, 903n) connected to the supply voltage when the input is a logic 0 (low).

The operation of the active cascaded bootstrapping gate driver 900 will now be described.

When input 'in' is a logic 1, which is equal to $V_{ddF}-V_L$, capacitor $C_D$ is charged to approximately $V_{ddF}-V_L$ by FET MDI, since the gates of FET 903 and FETs 903a-903n are driven to approximately $V_{ddF}-V_L$ by capacitor $C_1$. Note that capacitor $C_1$ recharges to approximately $V_{ddF}-V_L$ by FET 903, with voltage $V_{DI}$ being equal to approximately 2 ($V_{ddF}-V_L$) when the input 'in' is logic 0.

When input 'in' is logic 0, the output of the cascaded bootstrapping gate driver at the drain of FET 907a is logic 1, which is equal to approximately $V_{ddF}-V_L$, and the gate voltage $V_{SB}$ is approximately 2·($V_{ddF}-V_L$). Accordingly, the gate-source voltage $V_{GS}$ of the synchronous bootstrap FET 902 is approximately $V_{ddF}-V_L$. Hence, the synchronous bootstrap FET 902 can drive $V_F$ to approximately $V_{ddF}$.

Figure 10:
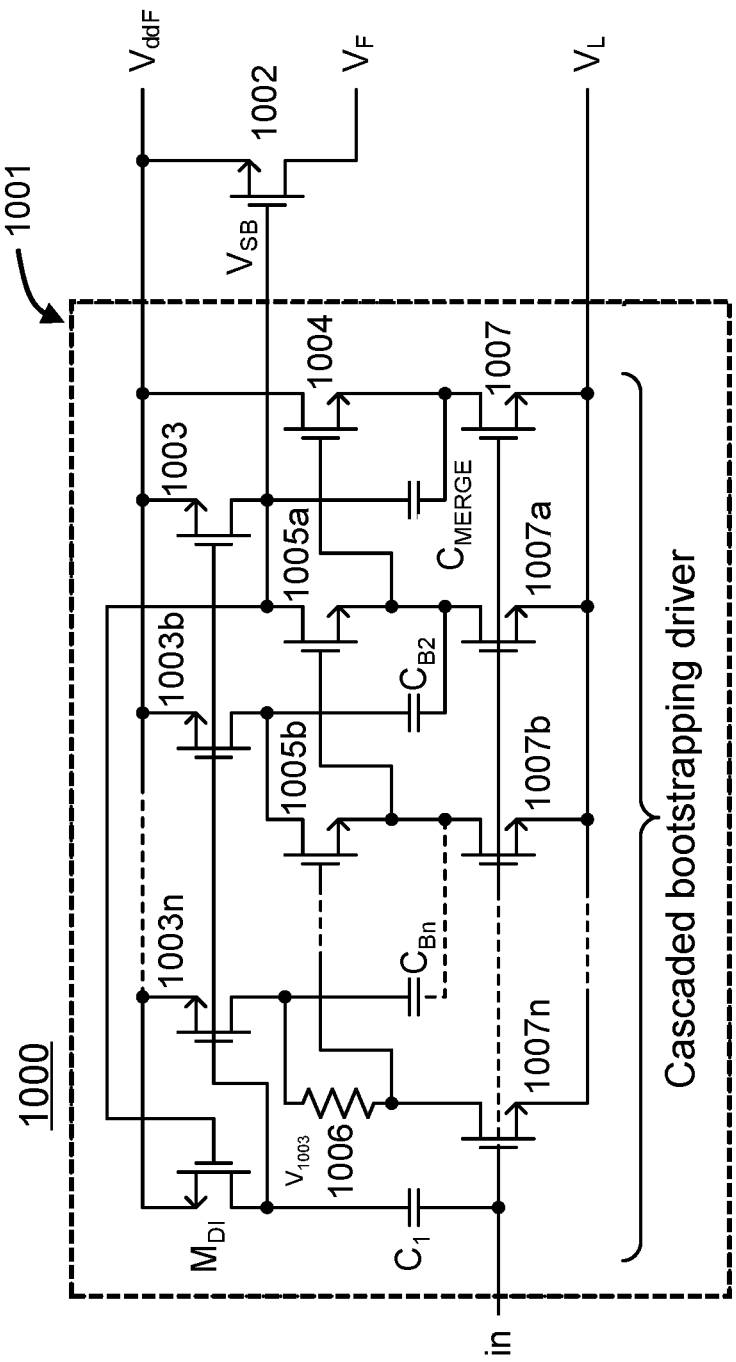
FIG. 10 shows a modification of the circuit of FIG. 9 in which two of the bootstrap capacitors and two of the FETs are merged.

FIG. 10 shows a synchronous bootstrap driver circuit 1000 similar to synchronous bootstrap driver circuit 900 of FIG. 9, but modified to merge bootstrapping capacitors $C_{B1}$ and $C_D$ into a single bootstrapping capacitor $C_{MERGE}$ and to merge FETs 903 and 903a into a single FET 1003. The merger of the above-noted capacitors and FETs of the circuit of FIG. 9 is possible because $V_{DI}$ and $V_{SB}$ are approximately the same, as they are both driven by the same cascaded bootstrapping driver output through bootstrap capacitors $C_{B1}$ and $C_D$. As a result, synchronous bootstrap FET 1002 can be driven directly by the cascaded bootstrap driver as shown.

Figure 11:
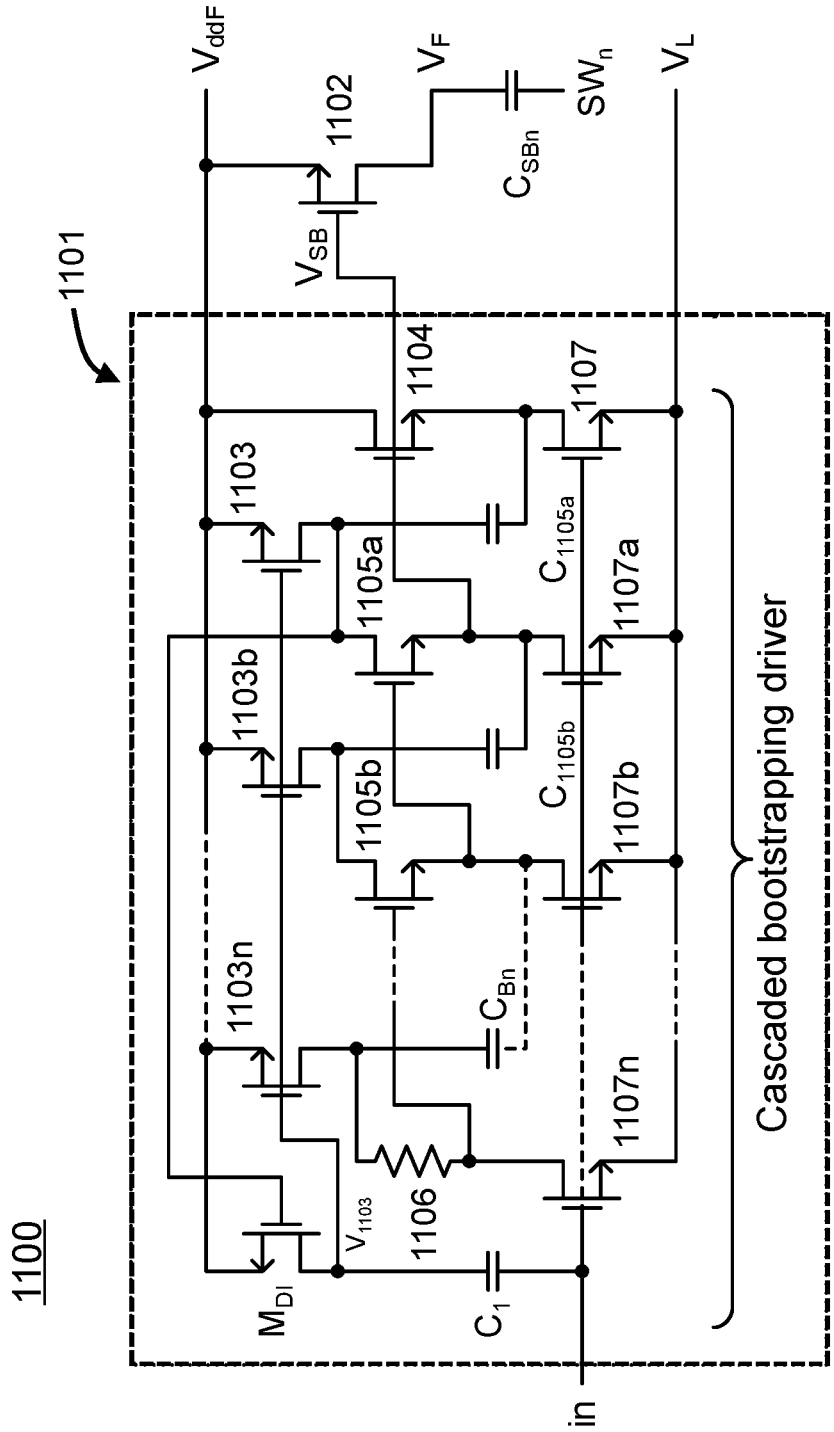
FIG. 11 shows a modification of the circuit of FIG. 10 with a wide switching range.

FIG. 11 shows a modification of the merged synchronous bootstrap driver circuit of FIG. 10 with a wide switching range. The merged synchronous bootstrap driver circuit 1100 of FIG. 11 is similar to the synchronous bootstrap driver circuit 1000 of FIG. 10, but the gate of synchronous bootstrap FET 1102 is connected to the gate of FET 1104.

In some instances, switching node $SW_n$ may swing a few volts below $V_L$ during a dead time period of the power converter. In such a case, synchronous bootstrap FET 1102 may need to be shut down before the dead time period begins, and the gate terminal voltage $V_{SB}$ may also require to have a turn-off voltage close to $V_L$ in order to prevent a possibility of overcharging the synchronous bootstrap capacitor $C_{SBn}$ during the dead time period. By connecting the gate of the synchronous bootstrap FET 1102 to the gate of FET 1104, the voltage swing for the gate terminal voltage $V_{SB}$ will be between approximately $2 \cdot (V_{ddF}-V_L)$ for turning-on the synchronous bootstrap FET 1102 and will be 0V (with reference to $V_L$) for turning-off the synchronous bootstrap FET 1102. Accordingly, the possibility of turning-on the synchronous bootstrap FET 1102 during the dead time period is minimized by the circuit of FIG. 11.

In summary, the universal power FET driver IC of the present invention integrates a synchronous bootstrap circuit in an isolation well of the driver IC. The architecture of the present invention allows a synchronous bootstrap capacitor connected to the synchronous bootstrap circuit (and to the corresponding switch node of a power converter) to float with the corresponding switch node. Due to this feature, the voltage on one synchronous bootstrapping capacitor can be used for charging up the synchronous bootstrapping capacitor of another synchronous bootstrap circuit in a separate isolation well connected to a different switch node. As a result, the supply voltages for the synchronous bootstrap circuits in different isolation wells can all be supplied from a single ground referenced supply. This allows the universal power FET driver IC architecture of the present invention to be used for implementing various power converter topologies, including multi-level converters, where the switch nodes of the power converter are not all switched to ground.

To reduce the voltage drops on the supply voltages for the synchronous gate driver circuits in the isolation wells, a cascaded active bootstrapping driver topology can be used to drive the synchronous bootstrap FET.

The synchronous bootstrap driver of the present invention is particularly suited for implementation in GaN technology using GaN FETs.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A gate driver integrated circuit, comprising a plurality of synchronous bootstrap circuits, each of the plurality of synchronous bootstrap circuit including a synchronous bootstrap gate driver and a synchronous bootstrap FET driven by the synchronous bootstrap gate driver, wherein the synchronous bootstrap FET is configured to charge a synchronous bootstrap capacitor connected to the synchronous bootstrap circuit, and wherein each of the plurality of synchronous bootstrap circuits is integrated in a separate isolation well of the gate driver integrated circuit, such that the synchronous bootstrap capacitor can float with a corresponding switch node of a power converter, and wherein a voltage stored on the synchronous bootstrap capacitor connected to the synchronous bootstrap circuit in one isolation well charges another synchronous bootstrap capacitor connected to another synchronous bootstrap circuit in a different isolation well.

2. The gate driver integrated circuit according to claim 1, wherein the synchronous bootstrap gate driver is driven by a NAND gate in the isolation well, wherein the NAND gate receives: (i) an output of a gate driver for driving a power FET and (ii) a level shifter for level shifting an input logic signal.

3. The gate driver integrated circuit according to claim 1, implemented in GaN technology.

4. The gate driver integrated circuit according to claim 2, further comprising Logic Translator and Power-On Reset (POR) circuitry, wherein the level shifter receives an input signal from the Logic Translator and POR circuitry and outputs a level shifted input signal to the synchronous bootstrap circuit.

5. The gate driver integrated circuit according to claim 1, wherein each of the plurality of synchronous bootstrap circuits comprises a cascaded synchronous bootstrap gate driver circuit.

6. A power integrated circuit according to claim 1, comprising two of the synchronous bootstrap circuits in separate isolation wells, wherein one of the two synchronous bootstrap circuits is a low-side synchronous bootstrap circuit and another of the two synchronous bootstrap circuits is a high-side synchronous bootstrap circuit, wherein the low-side synchronous bootstrap circuit receives a low-side signal for controlling a low-side power FET of a half bridge circuit, and the high-side synchronous bootstrap circuit is receives a high-side signal for controlling a high-side power FET of the half bridge circuit, and wherein a synchronous bootstrap capacitor connected to the low-side synchronous bootstrap circuit, and to a corresponding switch node of a power converter, can float with the corresponding switch node, such that a voltage stored on the synchronous bootstrapping capacitor can be used for powering the high-side synchronous bootstrap circuit.

7. A power integrated circuit according to claim 1, implemented in GaN technology.

* * * * *